Figure 1:
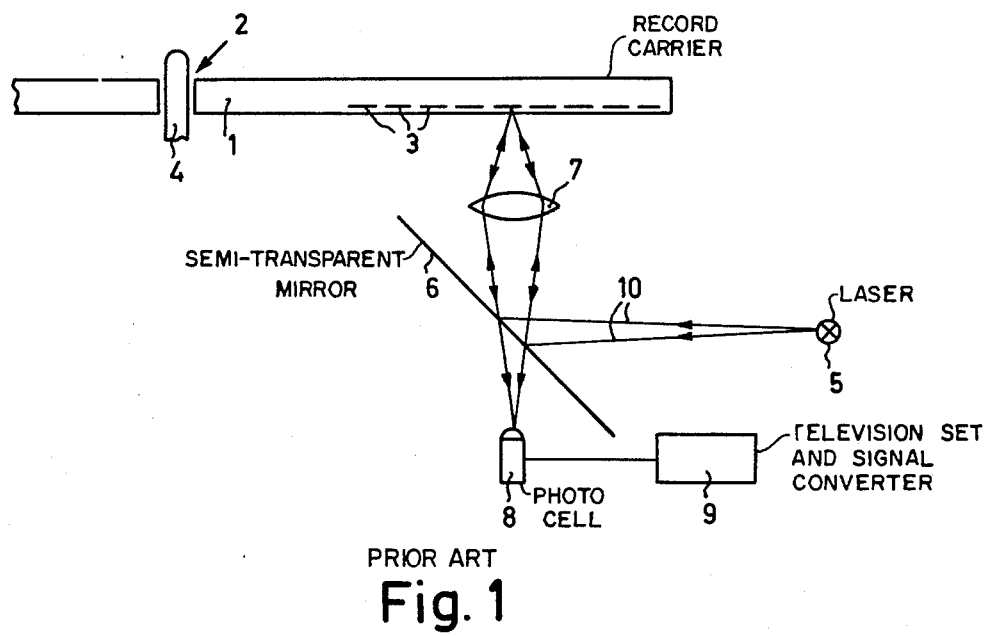

United States Patent [19]
Bouwhuis et al.

[11] 3,992,574
[45] Nov. 16, 1976

[54] OPTO-ELECTRONIC SYSTEM FOR DETERMINING A DEVIATION BETWEEN THE ACTUAL POSITION OF A RADIATION-REFLECTING PLANE IN AN OPTICAL IMAGING SYSTEM AND THE DESIRED POSITION OF SAID PLANE

[75] Inventors: Gijsbertus Bouwhuis; Josephus Johannes Maria Braat, Eindhoven, both of Netherlands

[73] Assignee: U.S. Philips Corporation, New York, N.Y.

[22] Filed: Feb. 14, 1974

[21] Appl. No.: 442,395

[30] Foreign Application Priority Data
Oct. 1, 1973  Netherlands .................... 7313454

[52] U.S. Cl. .................. 178/6.6 DD; 179/100.3 V; 250/201
[51] Int. Cl.² ..................... H04N 5/76; G11B 7/00
[58] Field of Search ............. 179/100.3 V, 100.4 R, 179/100.4 C; 178/6.7 A, 6.7 R, 6.6 DD; 250/201, 204, 211 J, 561; 353/101; 350/255; 356/4, 5

[56] References Cited
UNITED STATES PATENTS

| | | | |
|---|---|---|---|
| 3,198,880 | 8/1965 | Toulon | 178/6.7 |
| 3,381,086 | 4/1968 | DeMoss et al. | 179/100.3 V |
| 3,502,415 | 3/1970 | Hock | 250/232 |
| 3,612,695 | 10/1971 | Bouwhuis et al. | 250/237 G |
| 3,635,551 | 1/1972 | Szymber | 353/101 |
| 3,639,048 | 2/1972 | Heaney et al. | 353/101 |
| 3,756,723 | 9/1973 | Hock | 250/237 G |
| 3,833,769 | 9/1974 | Compaan et al. | 179/100.3 G |
| 3,876,842 | 4/1975 | Bouwhuis | 179/100.3 G |

FOREIGN PATENTS OR APPLICATIONS
1,103,050  3/1961  Germany ............................ 250/201

OTHER PUBLICATIONS

Frosch et al, Optical Surface Microtopography Measurement and/or Automatic Focussing, IBM Technical Disclosure Bulletin, vol. 15, No. 2, July, 1972, pp. 504–505.

*Primary Examiner*—Stuart N. Hecker
*Attorney, Agent, or Firm*—Frank R. Trifari; Simon L. Cohen

[57] ABSTRACT

An opto-electronic system is described for determining a deviation between the actual position of a radiation-reflecting plane in an optical imaging system and the desired position of said plane. Two auxiliary radiation sources are provided which are shifted in opposite directions relative to the optical axis of the imaging system and two radiation-sensitive detectors which are also shifted in opposite directions relative to the optical axis of the imaging system. Of the set of auxiliary radiation sources and the set of detectors the elements of one set are shifted relative to each other in the direction of the optical axis. The auxiliary radiation sources may be formed with the aid of a Fresnel zone plate.

5 Claims, 7 Drawing Figures

OPTO-ELECTRONIC SYSTEM FOR DETERMINING A DEVIATION BETWEEN THE ACTUAL POSITION OF A RADIATION-REFLECTING PLANE IN AN OPTICAL IMAGING SYSTEM AND THE DESIRED POSITION OF SAID PLANE

The invention relates to an opto-electronic system for determining a deviation between the actual position of a radiation-reflecting plane in an optical imaging system and the desired position of said plane.

For optical systems with which very small details are to be imaged, and which operate with a large numerical aperture, the depth of focus is small. For this type of imaging systems, which are for example used in microscopes or in devices for reading an optical information structure with very small details, it is important that a deviation between the actual plane of focussing and the desired plane of focussing can be detected so as to enable the focussing to be corrected with the aid thereof.

In particular for reading a record carrier provided with a reflecting optical structure, devices have been proposed, for example in the previous pending Pat. Application Ser. No. 358,994, filed May 10, 1973, now U.S. Pat. No. 3,876,841, for detecting a deviation between the actual position of the plane of the optical structure and the desired position of said plane, which desired position coincides with the position of the plane of focussing of an objective lens. In these devices a radiation source is imaged on two or more radiation-sensitive detectors via the radiation-reflecting surface of the optical structure. In the case of a displacement of the radiation-reflecting plane along the optical axis, the image is shifted over the detectors. By comparison of the electrical output signals of said detectors an indication can be obtained as to the magnitude and the direction of a deviation between the actual position of said plane and the desired position. In the radiation path in front of two detectors a radiation-absorbing screen may be disposed which, in the event of an incorrect position of the radiation-reflecting plane, causes one of the detectors to receive a higher radiation intensity than the other detector. It is also possible to image a multiplicity of slits onto themselves, said slits being arranged in accordance with a line which makes an acute angle with the radiation-reflecting plane in such a way that for a correct position of the radiation-reflecting plane detectors situated adjacent the slits receive no radiation. Finally a radiation beam may be employed whose principal ray is incident on the radiation-reflecting plane at an acute angle. Depending on the position of the radiation-reflecting plane the reflected beam passes through a lens at different heights, thus being refracted at different angles.

The opto-electronic system according to the invention is based on a different principle than the systems mentioned hereinbefore. The system according to the invention is characterized by at least two auxiliary radiation sources which are shifted in opposite directions relative to the optical axis of the imaging system and at least two radiation-sensitive detectors which are also shifted in opposite directions relative to the optical axis of the imaging system, each of the auxiliary radiation sources being associated with one detector via the imaging system, and the elements of one set of the set of auxiliary radiation sources and the set of detectors occupying different positions in the direction of the optical axis.

A preferred embodiment of an apparatus according to the invention is furthermore characterized in that the auxiliary radiation sources are derived from a main radiation source with the aid of a Fresnel zone plate which is disposed asymmetrically relative to the optical axis of the imaging system and that the detectors occupy the same position in the direction of said optical axis.

The Fresnel zone plate may then be included in the radiation path in front of the radiation-reflecting plane. However, said plate is preferably disposed at the exit of the imaging system in front of the detectors. Then the influence on the radiation path through the imaging system is minimal.

It is to be noted that from "Fourier-Transform Holograms by Fresnel Zone Plate Achromatic-Fringe Interferometer" in "Journal of the Optical Society of America", 59, No. 3, pages 303–307, it is known to form an auxiliary radiation source with the aid of a Fresnel zone plate, which source is axially and radially shifted relative to the main radiation source. Said article, however, describes a holographic device, which is completely different from a device for determining the position of a plane in an imaging system. Moreover, only one additional radiation source is formed in the known device.

The invention will now be explained with reference to a description of its application in an apparatus for reading a record carrier with an optical structure and an apparatus for writing information on such a record carrier. However, it is to be noted that the invention can be used more widely, namely in all imaging systems in which the position of a radiation reflecting plane is to be determined.

Figure 2:
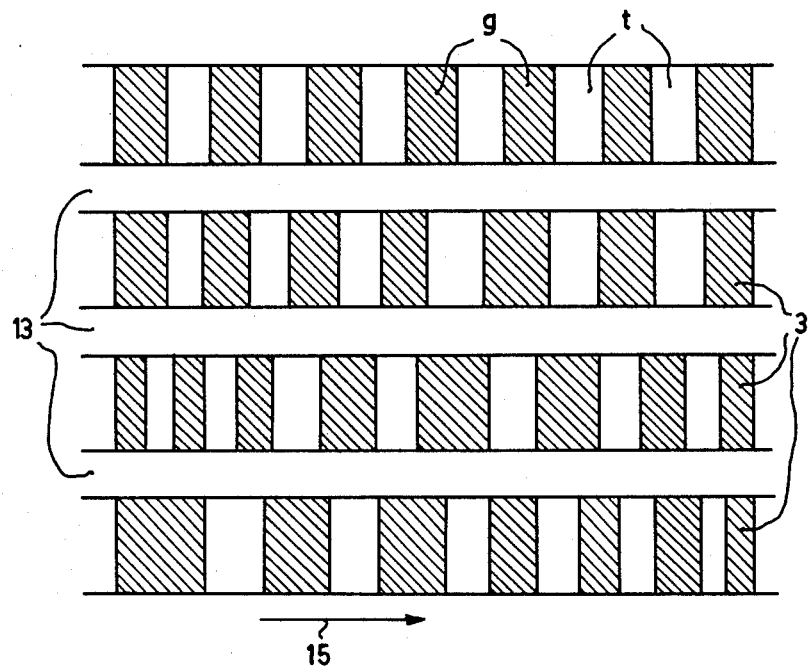
Figure 3A:
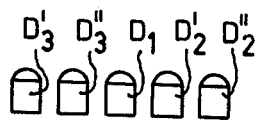
Figure 3:
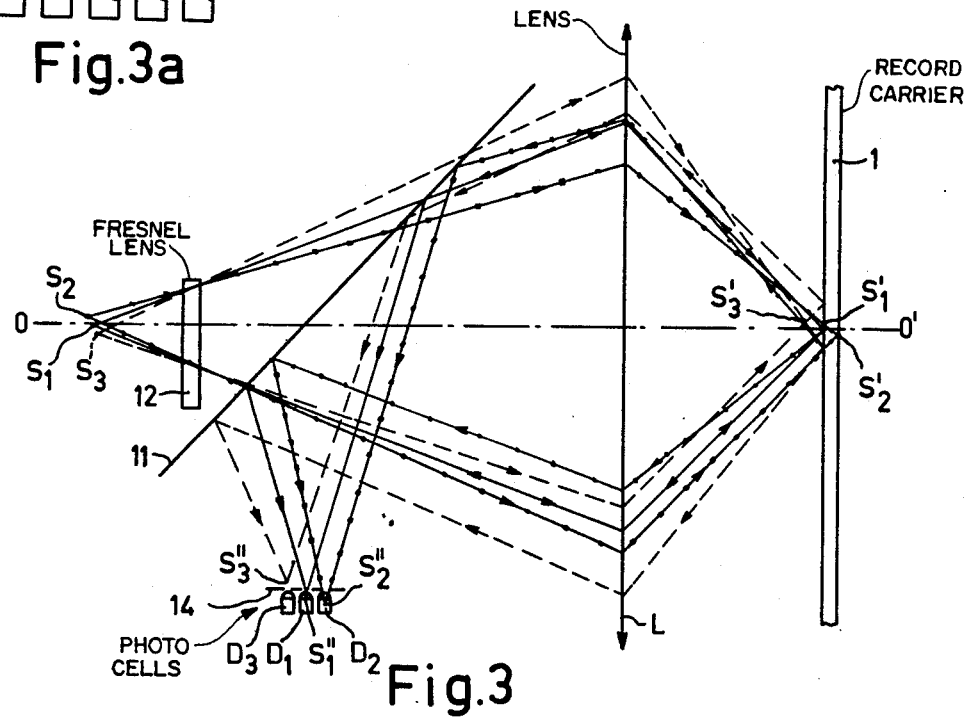
Figure 4:
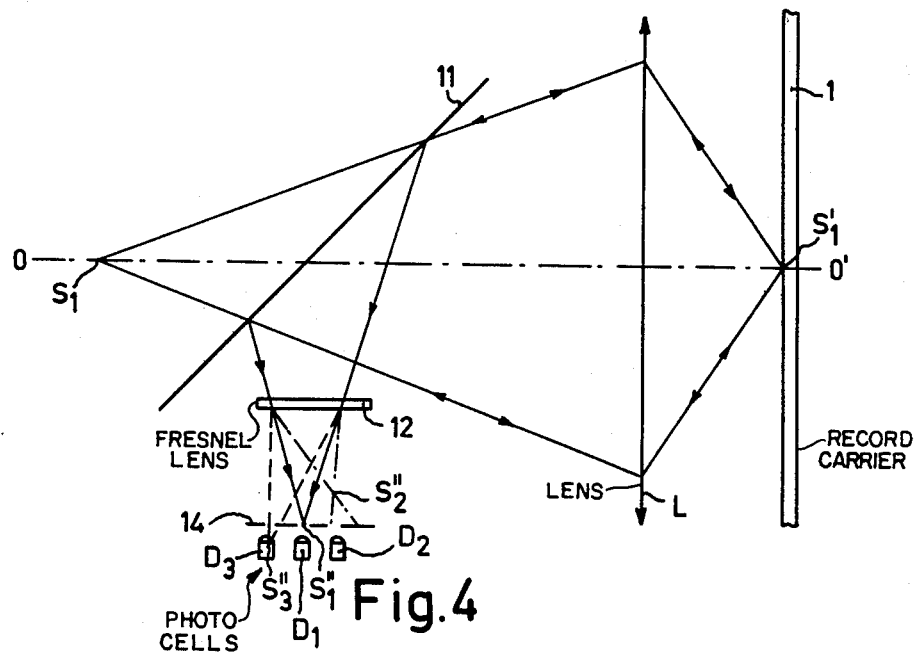
Figure 5:
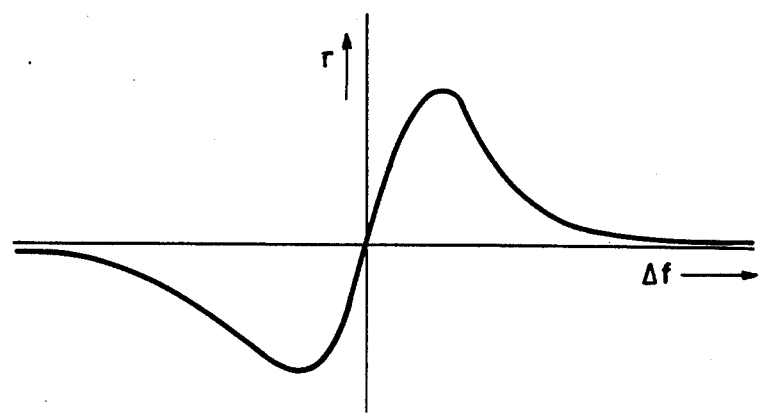
Figure 6:
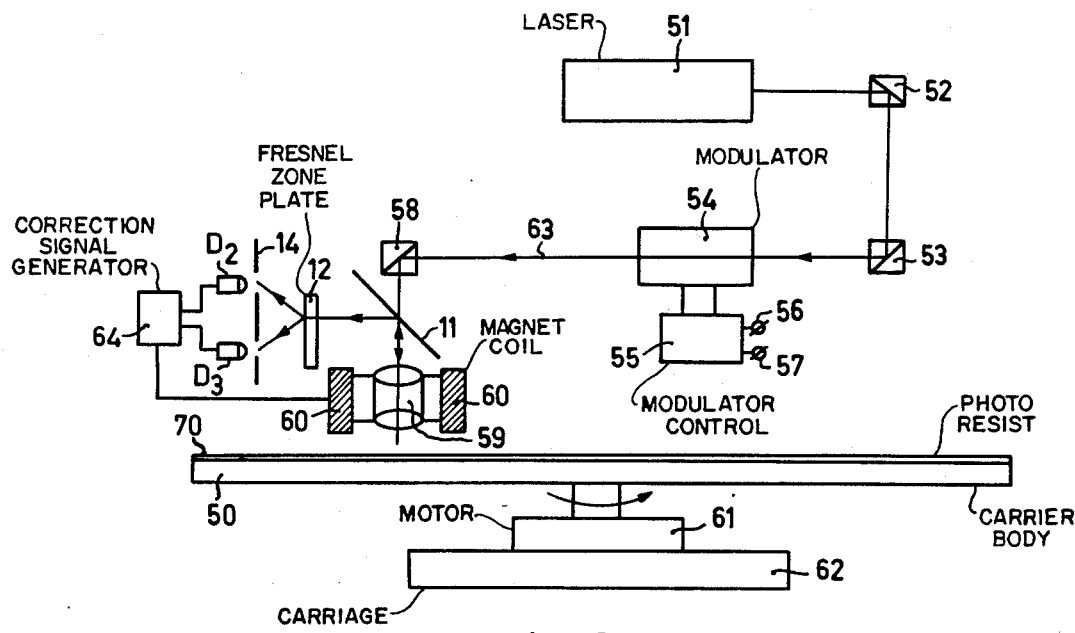

Reference will be made to the drawing, in which:

FIG. 1 represents a previously proposed apparatus for reading a reflecting record carrier, FIG. 2 represents a part of the optical structure of the record carrier to be read, FIG. 3, 3a and 4 show parts of embodiments of an apparatus according to the invention for reading a record carrier, FIG. 5 represents the control signal, obtained with the aid of the devices of FIGS. 3 and 4, as a function of the displacement of the plane of the optical structure, FIG. 6 shows an apparatus for writing on a record carrier body, which apparatus is provided with an opto-electronic system according to the invention.

In the apparatus of FIG. 1 a round record carrier 1, shown in radial cross-section, is rotated by a shaft 4, which extends through a central opening 2 in the record carrier, and which is driven by a motor, not shown. The radiation beam 10 produced by the radiation source 5 is reflected towards the record carrier by the semi-transparent mirror 6. The lens 7 focusses the radiation beam on one of the tracks 3, which are disposed at the underside of the record carrier. The beam, which has been modulated by a track, is reflected and traverses the lens 7 again, so that a small portion of the track to be read is imaged onto the radiation-sensitive signal detector 8 via the semi-transparent mirror 6. The output of the detector is connected to a device 9, comprising known electronic means, for converting the signal supplied by the detector to image and sound. Stringent requirements are imposed on the lens 7 because said lens should image only a small portion of the track, of the size of approximately the smallest detail in the optical structure on the detector.

Besides by the imaging of the details of the optical structure onto the detector, a radiation spot smaller than the details on the record carrier being formed, the record carrier may also be read by a radiation spot greater than those details. In that case use is made of the diffraction of the radiation at details, so that less radiation is incident on the detector if the radiation spot is projected onto a detail.

FIG. 2 shows a part of the optical structure of the record carrier in a bottom plan view. An arrow 15 indicates in which direction the record carrier is moved relative to the read system. The structure consists of a number of tracks 3 of areas $g$ alternating with intermediate areas $t$. Between the tracks 3 information-free lands 13 are located. The tracks 3 may be arranged on the record carrier parallel to each other, i.e. concentrically. The record carrier may also contain one spiral track, which track can be divided into a multiplicity of quasi-concentric tracks. The lengths of te areas and the intermediate areas represent the stored information. A radiation beam which has been modulated by a track exhibits variations in time in accordance with the sequence of areas and intermediate areas. The areas and intermediate areas of a track may be co-planar, the areas and intermediate areas having different reflection coefficients. The areas and intermediate areas may alternatively have the same coefficients of reflection, but are then situated at different levels.

For example, for reading a round record carrier with an average period of the areas of 1.5 $\mu$m for the inner tracks, the lens 7 should have a numerical aperture of 0.4. The depth of focus of the lens is then approximately 1 $\mu$m. The displacement of the plane of the optical structure relative to the lens 7 should be limited to said small depth of focus.

An apparatus according to the invention including means capable of detecting whether the plane of the optical structure is in the desired position is shown in FIG. 3.

In said apparatus the reference numeral 1 again denotes a reflecting record carrier. Said record carrier is read by means of a radiation beam, represented by uninterrupted lines, coming from a radiation source $s_1$. The radiation path from the radiation source to the record carrier includes a semi-transparent mirror 11, which reflects the rays that are reflected by the record carrier to the high-frequency signal detector $D_1$. In addition to the radiation source $s_1$ two further auxiliary radiation sources $S_3$ and $S_2$ respectively are provided, which emit the radiation beams represented by the dashed line and dash-and-dot lines respectively. The auxiliary sources are shifted in opposite directions relative to the source $s_1$ in the direction of the optical axis OO'. Further, the auxiliary radiation sources are disposed off the optical axis at either side. As a result, the images of the auxiliary radiation sources are separated from the image of the main radiation source.

The lens L forms images $s_2'$ and $s_3'$ of the auxiliary radiation sources $s_2$ and $s_3$. The rays reflected by the optical structure of the record carrier 1 traverse the lens L for a second time and are concentrated in the image points $s_2''$ and $s_3''$ via the semi-transparent mirror 11. At the location of the image $s_1''$ of the main radiation source a diaphragm 14 with three openings is disposed. Behind said openings apart from the signal detector $D_1$ two auxiliary detectors $D_2$ and $D_3$ are disposed. By comparing the radiation intensities intercepted by the detectors $D_2$ and $D_3$, the magnitude and the direction of a deviation between the position of the plane of the optical structure and the desired position of said plane can be determined.

FIG. 3 represents the situation in which the plane of the optical structure is in the correct position. The read beam of radiation, designated by continuous lines, is exactly focussed on the high-frequency signal detector $D_1$. The auxiliary beam from the source $s_3$, designated by the dashed line, is focussed in the point $s_3''$, which is situated before the radiation-sensitive surface of the auxiliary detector $D_3$, while the radiation beam from the auxiliary source $s_2$, which is designated by dash-and-dot lines, is focussed in the point $s_2''$ which is located behind the radiation-sensitive surface of the auxiliary detector $D_2$. The auxiliary detectors will receive approximately the same radiation intensity, which is smaller than the radiation intensity on the signal detector.

If the plane of the optical structure of the record carrier is moved to the left, the image points $s_1''$, $s_2''$ and $s_3''$ move downwards, so that the intensity of the radiation on the detector $D_3$ becomes greater than that on the detector $D_2$. In the case of a movement to the right of the plane of the optical structure the image points move upwards and the intensity of the radiation on the detector $D_2$ becomes greater than that on the detector $D_3$.

The accuracy with which the position of the plane of the optical structure can be determined in the manner described above, may not be high enough for some applications. To obtain a higher accuracy it is possible according to the invention to make use of the optical information structure present on the record carrier. Of the radiation beams which are incident on the detectors the average intensities are them no longer compared, but the modulation factor of the high frequency components. The range over which the last method of position determination can be used is smaller than the range for which the position determination by comparison of beam intensities can be used. The two methods, of detecting a deviation in the position of the plane of the optical structure, may also be combined in a single apparatus, in which case four detectors are required.

The electrical signals at the outputs of the detectors $D_2$ and $D_3$ may electronically be processed in known manner to a control signal with which the focussing of the read beam of radiation can be corrected, for example by readjustment of the lens L. FIG. 5 shows how the electronic control signal $r$ varies as a function of the focussing error $\Delta f$.

Instead of three radiation sources which are shifted along the optical axis in conjunction with three detectors which are in the same position in the direction of the optical axis, it is alternatively possible to use three radiation sources, which are in the same position in the direction of the optical axis, in conjunction with three detectors which are shifted in the direction of the optical axis.

The two auxiliary radiation sources $s_2$ and $s_3$, according to the invention, may be derived from the main radiation source $s_1$ with the aid of a so-called Fresnel zone plate. Such a plate may be composed of alternate transparent and opaque annular zones. Instead of such an amplitude structure it is equally possible to employ a phase structure, the consecutive annular zones causing a difference in phase in the radiation beam which corresponds to a path length difference of $\lambda/2$, $\lambda$ being the wavelength of the radiation used. The Fresnel zone plate behaves as a lens, however, focussing being effected by diffraction instead of by refraction of the light. In contra-distinction to a normal lens the Fresnel zone plate is both converging and diverging. In other words said plate has several focal points.

In the apparatus of FIG. 3 the rays of the beam coming from the source $s_1$ are diffracted so that two sub-beams are obtained which apparently originate from the virtual radiation sources $s_2$ and $s_3$. The Fresnel zone plate is arranged asymmetrically relative to the optical axis +". As a result, the virtual sources $s_2$ and $s_3$ are disposed at either side of the optical axis.

At this point it should be noted that the term "plurality of radiation sources" includes virtual sources as shown in FIG. 3. By a similar procedure of ray tracing the virtual sources used in FIG. 4 may be derived. Thus under the terms of the above definition both FIG. 3 and FIG. 4 are provided with a "plurality of radiation sources".

The use of a Fresnel zone plate as compared with the application of separate auxiliary radiation sources has the advantage that no mutual vibration can occur between the sources $s_2$ and $s_3$, which might affect the control signal. Moreover, a device in which a Fresnel zone plate is employed is of simpler construction than a device with separate auxiliary radiation sources.

Instead of in the radiation path in front of the radiation-reflecting plane, the Fresnel zone plate may also be disposed in the path of the read beam of radiation which is reflected by the record carrier. FIG. 4 shows such an arrangement. The Fresnel zone plate 12 diffracts the radiation beam which is reflected by the record carrier in different orders, so that sub-beams which are directed towards the image points $s_1''$, $s_2''$ and $s_3''$ are obtained. When moving the radiation reflecting plane of the record carrier to the right or to the left the image points move upwards or downwards, so that by comparing the intensities of the radiation intercepted by the detectors D2 and D3 the position of the radiation-reflecting plane can be detected. Instead of the intensities, the modulation factor of the high frequency components of the radiations incident on the detectors may also be compared in the device of FIG. 4.

When using a Fresnel zone plate in the device according to FIGS. 3 and 4, said plate could move in a direction perpendicular to the optical axis 00'. As a result, the images $s_2''$ and $s_3''$ also move over the detectors $D_2$ and $D_3$ so that an error signal is produced, the plane of the optical structure yet being in the correct position. Said inaccuracy can be avoided by dividing the detectors $D_2$ and $D_3$ into two sub-detectors as is shown in FIG. 3a. When the output signals of the detectors $D_2'$, $D_2''$, $D_3'$ and $D_3''$ are represented by $a$, $b$, $c$ and $d$ respectively, the signal $(c-d) - (b-a)$ for example will provide an indication of the magnitude and direction of a deviation between the desired position of the Fresnel zone plate and the actual position of said plate.

In an embodiment of an apparatus according to the invention for reading a record carrier, positional errors of the record carrier up to approximately 100 $\mu$m could be detected by comparison of the intensities of the radiation beams on the detectors $D_2$ and $D_3$. The distance between the radiation sources $s_2$ and $s_3$ was approximately 5 cm. When comparing the high-frequency modulations of the detector signals, positional errors up to approximately 10 $\mu$m could be detected, the distance between $s_2$ and $s_3$ being approximately ½ mm.

Besides for reading a record carrier provided with information, the system according to the invention may also be employed for writing information on a record carrier body. FIG. 6 shows an embodiment of such a write apparatus, which except for the elements for determining the position of the record carrier surface, has been proposed previously.

The apparatus includes a radiation source, for example a laser source 51, which supplies a radiation beam 63 of sufficient power. Said beam is directed at the record carrier body 50 to be written via the prisms 52, 53 and 58 and concentrated to a small radiation source by an objective lens 59. The record carrier body is provided with a layer 70 which is sensitive to the radiation used, for example a photo-resist layer. The radiation path from the source 51 to the record carrier body 50 further includes an electro-optic modulator 54. Said modulator is connected to the electronic control device 55. The information, for example a television programme, which is applied to the terminals 56 and 57 in the form of an electrical signal, is converted into pulses of radiation from the laser source. At certain instants, given by the information at the terminals 56 and 57, radiation spots are projected onto the record carrier body.

The record carrier body has a round circumference and is rotated about its spindle with the aid of a motor 61 which is radially movable by means of a carriage 62, so that for example a spiral track can be written on the record carrier body.

The objective lens 59 is axially, i.e. vertically, movable relative to the record carrier body and can be moved by energising a magnet coil 60. The magnitude of the electric current through the magnet coil is determined by an electronic circuit 64, in which the output signals of the radiation-sensitive detectors $D_2$ and $D_3$ are processed electronically. The detectors, in turn, form part of a system for determining the position of the record carrier surface, the operation of said system being described hereinbefore.

The record carrier body may be provided with a radiation-reflecting surface below the photo-resist layer. A separate auxiliary radiation beam may be projected on the record carrier body said auxiliary beam passes through a semi-transparent mirror 11 and subsequently through a Fresnel zone plate 12. The beams which are diffracted in the +1 and the −1 order by said plate reach the detectors $D_2$ and $D_3$ via two openings in a diaphragm 14. The zero-order beam is not needed in this case and may be suppressed.

Instead of a separate auxiliary radiation source it is alternatively possible to use the radiation of the write beam of radiation which is reflected by the record carrier body for determining the position of the radiation-sensitive surface of the record carrier body, as shown in FIG. 6.

What is claimed is:
1. An apparatus for reading a flat radiation reflecting record carrier on which information is recorded in an optically readable structure, comprising at least three radiation sensitive detectors, a radiation source, lens means for projecting the light from said radiation source to said record carrier and for projecting the light reflected from said record carrier to said radiation sensitive detectors along at least three different angu- larly separated paths, each path having a separate path axis that is angularly separated from the path axes of the other paths, said path axes being defined as the real center lines of the radiation along the three paths impinging on the radiation sensitive detectors and projections of the real center lines through each element of the apparatus, said lens means converging the radiation in the three paths at different convergence angles, the distance between said lens means and each of the detectors being substantially equal, one of said detectors providing an electrical signal corresponding to the recorded information, while the other detectors provide electrical focus detection signals.

2. An apparatus as claimed in claim 1, wherein said lens means comprises a Fresnel zone plate disposed in the light path between the radiation sensitive detectors and said radiation source, said detectors occupying the same position in the direction of said optical axis.

3. An opto-electronic system as claimed in claim 2, wherein the Fresnel zone plate is disposed in the radiation path between the radiation-reflecting record carrier and the radiation-sensitive detectors.

4. An opto-electronic system as claimed in claim 2, wherein two radiation-sensitive detectors are in each path.

5. An apparatus for providing focus detection signals in a device for writing information on a radiation-sensitive layer of a reflective record carrier body, said apparatus comprising a radiation source for supplying a write beam of radiation, a modulator for modulating the intensity of said write beam of radiation in accordance with the information to be written, at least two radiation-sensitive detectors, lens means for projecting the light from said radiation source to said record carrier and for projecting the light reflected from said record carrier to said detectors along at least two different angularly separated paths each path having a separate path axis that is angularly separated from the path axes of the other paths, said path axes being defined as the real center line of the radiation along the two paths impinging on the radiation sensitive detectors and projections of the real center lines through each element of the apparatus, said lens means converging the radiation in the two paths at different convergence angles, the distance between said lens means and each of the detectors being substantially equal, said detectors providing electrical focus detection signals.

* * * * *